United States Patent
Gollub et al.

(10) Patent No.: US 9,009,548 B2
(45) Date of Patent: Apr. 14, 2015

(54) MEMORY TESTING OF THREE DIMENSIONAL (3D) STACKED MEMORY

(71) Applicant: International Business Machines Corporation, Armonk, NY (US)

(72) Inventors: Marc A. Gollub, Round Rock, TX (US); Girisankar Paulraj, Tamilnadu (IN); Diyanesh B. Vidyapoornachary, Bangalore (IN); Kenneth L. Wright, Austin, TX (US)

(73) Assignee: International Business Machines Corporation, Armonk, NY (US)

(*) Notice: Subject to any disclaimer, the term of this patent is extended or adjusted under 35 U.S.C. 154(b) by 171 days.

(21) Appl. No.: 13/737,063

(22) Filed: Jan. 9, 2013

(65) Prior Publication Data

US 2014/0195852 A1    Jul. 10, 2014

(51) Int. Cl.
*G11C 29/00* (2006.01)
*G11C 7/00* (2006.01)
*G11C 29/10* (2006.01)
*G11C 29/26* (2006.01)
*G11C 5/04* (2006.01)

(52) U.S. Cl.
CPC ........ *G11C 29/10* (2013.01); *G11C 5/04* (2013.01); *G11C 29/26* (2013.01)

(58) Field of Classification Search
USPC ............ 714/18, 763, 768, 769, 770, 772, 6.1, 714/6.2, 6.21, 6.23, 54; 365/185.11, 200, 365/201; 711/100, 111, 112, 114, 132, 145
See application file for complete search history.

(56) References Cited

U.S. PATENT DOCUMENTS

| | | | |
|---|---|---|---|
| 5,267,242 A | 11/1993 | Lavallee et al. | |
| 5,961,653 A | 10/1999 | Kalter et al. | |
| 6,480,982 B1 | 11/2002 | Chan et al. | |
| 7,219,271 B2 | 5/2007 | Kleveland et al. | |
| 7,610,423 B2 | 10/2009 | Gower et al. | |
| 7,797,594 B1 | 9/2010 | Parulkar et al. | |
| 7,954,029 B2 | 5/2011 | Resnick | |
| 8,139,430 B2 | 3/2012 | Buchmann et al. | |
| 8,176,371 B2 | 5/2012 | Jeddeloh | |
| 2010/0162037 A1 | 6/2010 | Maule et al. | |
| 2010/0180154 A1 | 7/2010 | Bellows | |
| 2012/0096218 A1 | 4/2012 | Ahmad et al. | |
| 2012/0155192 A1* | 6/2012 | Ryu | 365/189.05 |
| 2013/0159812 A1* | 6/2013 | Loh et al. | 714/758 |
| 2014/0108885 A1* | 4/2014 | Loh et al. | 714/763 |

OTHER PUBLICATIONS

Wang, et al., "Hierarchical Fault Tolerance Memory Architecture with 3-Dimension Interconnect", TENCON 2007—2007 IEEE Region 10 Conference, 2007, pp. 1-4.

Chang, et al., "A Built-In Redundancy-Analysis Scheme for RAM's with 3D Redundancy", International Symposium on Digital VLSI Design, Automation and Test (VLSI-DAT), 2011, pp. 1-4.

* cited by examiner

*Primary Examiner* — Christine Tu
(74) *Attorney, Agent, or Firm* — Toler Law Group (57) ABSTRACT

A method includes reading, at a memory controller, data from a first dynamic random-access memory (DRAM) die layer of a DRAM stack. The method also includes writing the data to a second DRAM die layer of the DRAM stack. The method further includes sending a request to a test engine to test the first DRAM die layer after writing the data to the second DRAM die layer.

18 Claims, 9 Drawing Sheets

Mode Register Set (MRS) 302

| A field 310 | A15 | A14 | A13 | A12 | A11 | A10 | A9 | A8 | A7 | A6 | A5 | A4 | A3 | A2 | A1 | A0 |
|---|---|---|---|---|---|---|---|---|---|---|---|---|---|---|---|---|
| | B4 | B3 | B2 | B1 | B0 | S3 | S2 | S1 | S0 | M2 | M1 | M0 | E3 | E2 | E1 | E0 |

B field 312    S field 314    M field 316    E field 318

Control Fields 304
B[4:0] -> Failed Byte/Nibble
S[3:0] -> Failed Die
M[2:0] -> MCBIST status
E[3:0] -> Error Signature

Output from Memory Controller (MC) 306
Note: Only selected byte gets message

| B4 | B3 | B2 | B1 | B0 | Byte Control |
|---|---|---|---|---|---|
| 0 | 0 | 0 | 0 | 0 | Byte 0 Failed - L.Nibble |
| 0 | 0 | 0 | 0 | 1 | Byte 0 Failed - U.Nibble |
| 0 | 0 | 0 | 1 | 0 | Byte 1 Failed - L.Nibble |
| 0 | 0 | 0 | 1 | 1 | Byte 1 Failed - U.Nibble |
| 0 | 0 | 1 | 0 | 0 | Byte 2 Failed - L.Nibble |
| 0 | 0 | 1 | 0 | 1 | Byte 2 Failed - U.Nibble |
| 0 | 0 | 1 | 1 | 0 | Byte 3 Failed - L.Nibble |
| 0 | 0 | 1 | 1 | 1 | Byte 3 Failed - U.Nibble |
| 0 | 1 | 0 | 0 | 0 | Byte 4 Failed - L.Nibble |
| 0 | 1 | 0 | 0 | 1 | Byte 4 Failed - U.Nibble |
| 0 | 1 | 0 | 1 | 0 | Byte 5 Failed - L.Nibble |
| 0 | 1 | 0 | 1 | 1 | Byte 5 Failed - U.Nibble |
| 0 | 1 | 1 | 0 | 0 | Byte 6 Failed - L.Nibble |
| 0 | 1 | 1 | 0 | 1 | Byte 6 Failed - U.Nibble |
| 0 | 1 | 1 | 1 | 0 | Byte 7 Failed - L.Nibble |
| 0 | 1 | 1 | 1 | 1 | Byte 7 Failed - U.Nibble |
| 1 | 0 | 0 | 0 | 0 | Byte 8 Failed - L.Nibble |
| 1 | 0 | 0 | 0 | 1 | Byte 8 Failed - U.Nibble |

FIG. 3

| M2 | M1 | M0 | Memory Card Built-In Self-Test (MCBIST) Control/Status 402 |
|---|---|---|---|
| | | | Output from MC |
| 0 | 0 | 0 | Steer to spare |
| 0 | 0 | 1 | Start MCBIST |
| | | | Status read by MC |
| 0 | 1 | 0 | MCBIST complete |
| 0 | 1 | 1 | Unused |
| 1 | 0 | 0 | Unused |
| 1 | 0 | 1 | Unused |
| 1 | 1 | 0 | Unused |
| 1 | 1 | 1 | Unused |

| Status Read by Memory Controller (MC) 408 | | | | |
|---|---|---|---|---|
| E3 | E2 | E1 | E0 | Die error Status |
| 0 | 0 | 0 | 0 | 4-bit miscompare |
| 0 | 0 | 0 | 1 | 8-bit miscompare |
| 0 | 0 | 1 | 0 | No Error |
| 0 | 0 | 1 | 1 | Unused |
| 0 | 1 | 0 | 0 | Unused |
| 0 | 1 | 0 | 1 | Unused |
| 0 | 1 | 1 | 0 | Unused |
| 0 | 1 | 1 | 1 | Unused |
| 1 | 0 | 0 | 0 | Unused |
| 1 | 0 | 0 | 1 | Unused |
| 1 | 0 | 1 | 0 | Unused |
| 1 | 0 | 1 | 1 | Unused |
| 1 | 1 | 0 | 0 | Unused |
| 1 | 1 | 0 | 1 | Unused |
| 1 | 1 | 1 | 0 | Unused |
| 1 | 1 | 1 | 1 | Unused |

| Output from MC 410 | | | | |
|---|---|---|---|---|
| S3 | S2 | S1 | S0 | Die Control |
| 0 | 0 | 0 | 0 | Die 0 replaced |
| 0 | 0 | 0 | 1 | Die 1 replaced |
| 0 | 0 | 1 | 0 | Die 2 replaced |
| 0 | 0 | 1 | 1 | Die 3 replaced |
| 0 | 1 | 0 | 0 | Die 4 replaced |
| 0 | 1 | 0 | 1 | Die 5 replaced |
| 0 | 1 | 1 | 0 | Die 6 replaced |
| 0 | 1 | 1 | 1 | Die 7 replaced |
| 1 | 0 | 0 | 0 | Spare die unused |
| 1 | 0 | 0 | 1 | Unused |
| 1 | 0 | 1 | 0 | Unused |
| 1 | 0 | 1 | 1 | Unused |
| 1 | 1 | 0 | 0 | Unused |
| 1 | 1 | 0 | 1 | Unused |
| 1 | 1 | 1 | 0 | Unused |
| 1 | 1 | 1 | 1 | Unused |

MEMORY TESTING OF THREE DIMENSIONAL (3D) STACKED MEMORY

BACKGROUND

The present disclosure relates to memory testing, and more specifically, to memory testing of three dimensional (3D) stacked memory. Errors in a memory cell of a computing system may be caused by a manufacturing defect, degradation over time, breakage, electrical or magnetic interference, etc. Redundant memory cells may be used to record parity and enable detection of errors. However, parity checking may detect limited types of errors (e.g., single-bit errors), leaving other errors undetected. A suite of test patterns may be developed to detect various types of errors. However, using test patterns may require that the computing system be offline during memory testing. Additionally, when an error is detected in a memory cell of a three-dimensional (3D) stacked memory, the entire stack of memory may have to be replaced with a redundant stack.

SUMMARY

According to a particular embodiment, a method includes reading, at a memory controller, data from a first dynamic random-access memory (DRAM) die layer of a DRAM stack. The method also includes writing the data to a second DRAM die layer of the DRAM stack. The method further includes sending a request to a test engine to test the first DRAM die layer after writing the data to the second DRAM die layer.

In another particular embodiment, an apparatus includes a dynamic random-access memory (DRAM) stack. The DRAM stack includes a first DRAM die layer and a logic DRAM die layer. The logic DRAM die layer includes logic configured to receive a request to test the first DRAM die layer, perform testing of the first DRAM die layer in response to the request, and generate a result of testing the first DRAM die layer. The result indicates whether a fault was detected at the first DRAM die layer.

In yet another particular embodiment, a computer-readable storage medium stores instructions. The instructions, when executed by a processor, cause the processor to read data from a first dynamic random-access memory (DRAM) die layer of a DRAM stack including a plurality of stacked DRAM die layers. The instructions, when executed by the processor, also cause the processor to write the data to a second DRAM die layer of the DRAM stack and, after writing the data to the second DRAM die layer, send a request to a test engine to test the first DRAM die layer.

DETAILED DESCRIPTION

Systems and methods of performing memory testing of 3D stacked memory are disclosed. For example, testing of a target dynamic random-access memory (DRAM) die layer of a DRAM stack may occur after data of the target DRAM die layer is copied to and accessed from a spare DRAM die layer of the DRAM stack. A test pattern may be written to a memory location of the target DRAM die layer and compared to a value read from the memory location. A fault may be detected when the test pattern and the value read from the memory location do not match. The chances of detecting a fault may be improved by using several different test patterns designed to detect various kinds of faults (e.g., faults which may not be detectable by using other memory testing algorithms, such as parity checking).

The disclosed techniques may enable runtime memory testing. For example, to test a target DRAM die layer, user data at the target DRAM die layer may be copied to a spare DRAM die layer. An access (e.g., a read access) of the user data at a memory location of the target DRAM die layer may be directed initially to an error correction code (ECC) decoder (e.g., while the user data at the memory location is being copied to the spare DRAM die layer). Subsequently, the access may be directed to the spare DRAM die layer, while the target DRAM die layer is being tested by writing test patterns to the memory location. Embodiments of the disclosure may write a test pattern to the memory location and compare the test pattern to a value read from the memory location to determine whether a fault is detected. The chances of detecting a fault may be improved by using several different test patterns designed to detect various kinds of faults. The ECC decoder may be available to correct other errors while accesses are being directed to the spare DRAM die layer. If a fault is detected during testing, the spare DRAM die layer may be used in place of the target DRAM die layer. Thus, memory testing with a greater probability of detecting a fault during runtime may be achieved while access of the user data at the memory location is handled by the ECC decoder and the spare DRAM die layer.

Figure 1:
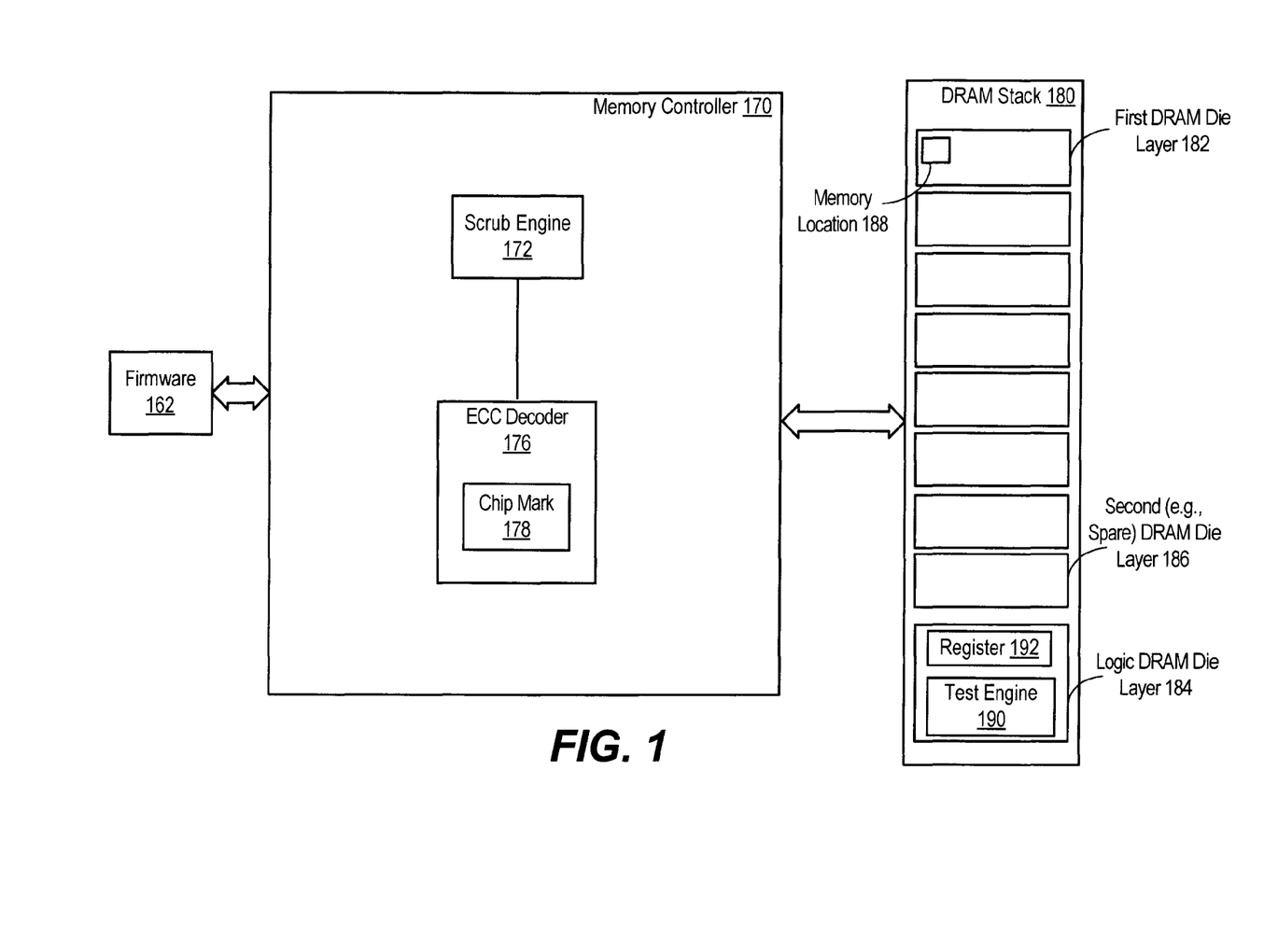
FIG. 1 is a block diagram of exemplary automated computing machinery including an exemplary computer useful in memory testing consistent with a disclosed embodiment.

Turning to the drawings, where like numbers denote like parts throughout the several views, FIG. 1 illustrates one exemplary implementation of a computer that is operable to perform memory testing of 3D stacked memory. In FIG. 1, the computer includes firmware 162 coupled to a dynamic random-access memory (DRAM) stack 180 through a memory controller 170. The DRAM stack 180 includes a set of stacked DRAM die layers including a first DRAM die layer 182, a second (e.g., spare) DRAM die layer 186, and a logic DRAM die layer 184. The logic DRAM die layer 184 may include a test engine 190 and a register 192. The test engine 190 may include or correspond to logic, circuitry, software, or a combination thereof, that is operable to implement testing of one or more DRAM die layers of the DRAM stack 180. The DRAM die layers may have a particular width (e.g., 8-bit, 4-bit, etc.). Although the DRAM stack 180 is illustrated in FIG. 1 as including 9 DRAM die layers, in various embodiments the DRAM stack 180 may have more than 9 or fewer than 9 DRAM die layers. The DRAM stack 180 may have different numbers (e.g., 9, 10, etc.) of DRAM die layers. Each of the DRAM die layers may have one or more memory locations, such as illustrative memory location 188. The memory locations may be of various sizes (e.g., a byte, a nibble, etc.). The DRAM die layers of a DRAM stack, such as the DRAM stack 180 may be accessed simultaneously. A rank may include one or more DRAM stacks (e.g., 9, 18, etc.). A single dual in-line memory module (DIMM) may include one or more ranks (e.g., 1, 2, 4, 8, etc.). Random-access memory (RAM) of a computing system may include one or more DIMMs.

The memory controller 170 includes a scrub engine 172 coupled to an error correction code (ECC) decoder 176. The ECC decoder 176 may include a chip mark 178 indicating that an access (e.g., a read access) by the memory controller 170 of the memory location 188 (e.g., an upper nibble of the first DRAM die layer 182, a lower nibble of the first DRAM die layer 182, or the first DRAM die layer 182) is to be directed to the ECC decoder 176. In a particular embodiment, the chip mark 178 may be placed by the firmware 162 as part of a periodic memory health check. In another particular embodiment, the chip mark 178 may be placed by the ECC decoder 176 in response to detecting an error at the memory location 188.

In a particular embodiment, the firmware 162 may be executable to direct the memory controller 170 to initiate runtime memory testing at the memory location 188 based on detecting the chip mark 178, as part of a periodic memory health check, or both. When the memory controller 170 initiates runtime memory testing, the memory controller 170 may copy data associated with the memory location 188 of the first DRAM die layer 182 to the second DRAM die layer 186. The memory controller 170 may also request the test engine 190 to enable an access of the memory location 188 of the first DRAM die layer 182 to be directed to the second DRAM die layer 186. The memory controller 170 may request the test engine 190 to start diagnostics of the memory location 188.

The test engine 190 may perform testing and may store a result of the memory testing in the register 192. The result may indicate whether a fault was detected at the memory location 188 of the first DRAM die layer 182. When a fault is detected, the memory controller 170 may determine that the second DRAM die layer 186 is to continue to be used in place of the first DRAM die layer 182 (or the memory location 188) and that the second DRAM die layer 186 (or a memory location of the second DRAM die layer 186) is unavailable to be used as a spare DRAM die layer (or as a spare memory location). On the other hand, when a fault is not detected, the memory controller 170 may copy data associated with memory location 188 to the first DRAM die layer 182 and request the test engine 190 to direct an access of the second DRAM die layer 186 to the first DRAM die layer 182.

During operation, the firmware 162 or the ECC decoder 176 may place a chip mark so that a read access by the memory controller 170 of a memory location 188 of the first DRAM die layer 182 (e.g., an upper nibble of the first DRAM die layer 182, a lower nibble of the first DRAM die layer 182, or the first DRAM die layer 182) will receive data from the ECC decoder 176. The ECC decoder 176 may provide data associated with the memory location 188 that has been corrected based on parity bits. In a particular embodiment, the firmware 162 may place a chip mark associated with each DRAM die layer (or with each memory location of each DRAM die layer) of the DRAM stack 180 in turn as memory diagnostics are performed. In a particular embodiment, the ECC decoder 176 may place the chip mark 178 in response to detecting an error at the memory location 188.

The chip mark 178 may be placed by setting an error bit associated with the memory location 188 (e.g., a bit, a nibble, a byte, a half word, a word, a double word, a block, 1 bit, 4 bits, 8 bits, 16 bits, 32 bits, 64 bits, etc.), by setting an error bit associated with the first DRAM die layer 182, by setting an error bit associated with the DRAM stack 180, by adding an identifier of the memory location 188, the first DRAM die layer 182 and/or the DRAM stack 180 in a mark table that stores chip marks data, or a combination thereof.

The firmware 162 may direct the memory controller 170 to initiate memory testing of the first DRAM die layer 182. For example, the firmware 162 may request the memory controller 170 to initiate memory testing of the first DRAM die layer 182 after placing a chip mark as part of the periodic memory testing. As another example, the firmware 162 may direct the memory controller 170 to initiate memory testing in response to detecting a chip mark (e.g., placed by the ECC decoder 176 or placed by the firmware 162). To illustrate, the firmware 162 may detect an error bit associated with the memory location 188 during a memory access (e.g., during reboot, during a memory test, by an application, by an operating system, etc.) and direct the memory controller 170 to initiate memory testing.

Without the chip mark 178 in place, any access (e.g., a read access, a write access, or both) of user data by the memory controller 170 may be directed by the logic DRAM die layer 184. With the chip mark 178 in place (e.g., when a bit corresponding to the chip mark 178 has a particular value indicating that the chip mark 178 is set for the memory location 188), a read access of user data at the memory location 188 by the memory controller 170 may receive the user data associated with the memory location 188 from the ECC decoder 176 and the read access may not be directed by the logic DRAM die layer 184. While the chip mark 178 is in place, the ECC decoder 176 may use parity bits to generate data associated with the memory location 188 and provide the generated data in response to the read access of the memory location 188.

The memory controller 170 may also send a request to the test engine 190 to enable the logic DRAM die layer 184 to direct any access (e.g., a read access, a write access, or both) of the memory location 188 of the first DRAM die layer 182 by the memory controller 170 received by the logic DRAM die layer 184 (e.g., a read access after the chip mark 178 is removed, a write access with or without the chip mark 178 in place) to the second DRAM die layer 186. For example, the memory controller 170 may send a mode register set (MRS) command requesting enabling the logic DRAM die layer 184 to direct an access of the memory location 188 of the first DRAM die layer 182 received by the logic DRAM die layer 184 to a spare DRAM die layer. Particular examples of a MRS command are further described with reference to FIGS. 3-4.

The test engine 190 (e.g., a memory card built-in self-test (MCBIST)) may enable the logic DRAM die layer 184 to direct an access by the memory controller 170 of the memory location 188 received by the logic DRAM die layer 184 to the second DRAM die layer 186.

The test engine 190 may provide a value and a control signal to a multiplexer (MUX) of the logic DRAM die layer 184 to enable the logic DRAM die layer 184 to direct the access by the memory controller 170 of the memory location 188 received by the logic DRAM die layer 184 to the second DRAM die layer 186. For example, the test engine 190 may provide a first control signal and a first value (e.g., an identifier associated with the memory controller 170) to a first MUX of the logic DRAM die layer 184 associated with the first DRAM die layer 182 to disable an access (e.g., a read access, a write access, or both) by the memory controller 170 of the memory location 188 of the first DRAM die layer 182. The test engine 190 may provide a second control signal and a second value (e.g., an identifier associated with the memory controller 170, an identifier associated with the first DRAM die layer 182, or both) to a second MUX of the logic DRAM die layer 184 associated with the second DRAM die layer 186 to enable an access by the memory controller 170 of the memory location 188 of the first DRAM die layer 182 to be directed to the second DRAM die layer 186.

The logic DRAM die layer 184 may be enabled to direct an access by the memory controller 170 received by the logic DRAM die layer 184 of the memory location 188 to the second DRAM die layer 186. While the chip mark 178 is in place, a read access of the memory location 188 may be directed to the ECC decoder 176. After the chip mark 178 is removed and an access to the memory location 188 of the first DRAM die layer 182 is no longer directed to the ECC decoder 176, the logic DRAM die layer 184 may direct an access of the memory location 188 of the first DRAM die layer 182 to the second DRAM die layer 186. Thus, access of the user data associated with the memory location 188 is enabled initially via the ECC decoder 176 and subsequently via the second DRAM die layer 186 while memory testing is in progress. After the chip mark 178 is removed (e.g., after completion of an atomic read-modify-write operation copying data associated with the memory location 188 to the second DRAM die layer 186) and access to the user data is enabled via the second DRAM die layer 186, the ECC decoder 176 may be available to correct other errors.

The scrub engine 172 of the memory controller 170 may perform an atomic read-modify-write of the DRAM stack 180. For example, the scrub engine 170 may read data from all of the DRAM die layers of the DRAM stack 180, modify the data by copying data associated with the memory location 188 over the data read from the second DRAM die layer 186, and write the modified data back to the DRAM die layers. In a particular embodiment, the read access of all of the DRAM die layers may receive data associated with the memory location 188 from the ECC decoder 176 because the chip mark 178 is in place. The write access associated with the memory location 188 may be directed by the logical DRAM die layer 184 to the second DRAM die layer 186.

While the atomic read-modify-write operation is in progress, data at the DRAM die layers may not be changed by other accesses to the DRAM die layers because other accesses to the DRAM die layers may be disabled. After the atomic read-modify-write operation is complete, the memory controller 170 may remove the chip mark 178 so that subsequent accesses of the memory location 188 of the first DRAM die layer 182 may be directed to the second DRAM die layer 186 by the logic DRAM die layer 184.

After the chip mark 178 is removed, the memory controller 170 may direct the test engine 190 to start memory testing of the memory location 188 of the first DRAM die layer 182. For example, the memory controller 170 may send a MRS command requesting the test engine 190 to begin memory testing and indicating the memory location 188 of the first DRAM die layer 182. In a particular embodiment, the test engine 190 may write a test pattern (e.g., all 1's) to the memory location 188 and read a value from the memory location 188. For example, the first MUX associated with the first DRAM die layer 182 may enable an access of the first DRAM die layer 182 by the test engine 190 while an access by the memory controller 170 is disabled. The test engine 190 may determine whether a fault is detected at the memory location 188 based on a comparison of the test pattern and the value read from the memory location 188. The test engine 190 may write multiple test patterns in turn to the memory location 188 and perform a comparison after each write with a value read from the memory location 188. The test patterns may be designed to check for different kinds of faults. For example, each of the test patterns may be generated based on a testing algorithm (e.g., zero-one, checkerboard, galloping (GALPAT), walking $\frac{1}{10}$, sliding diagonal, butterfly, march, etc.). The test pattern may be "00000000", "11111111", "01010101", "10101010", "11001100", etc. The test engine 190 may update the register 192 to store a result of the memory testing indicating whether a fault was detected at the memory location 188 of the first DRAM die layer 182.

The memory controller 170 may determine whether the test engine 190 has completed the memory testing. For example, the memory controller 170 may check a status of the testing by reading a value in a register (e.g., the register 192). In response to the status indicating that the test engine 190 has completed the memory testing, the memory controller 170 may read a result of the testing from the register (i.e., the register 192). In a particular embodiment, the test engine 190 may store a MRS command in the register indicating the status of the testing, the result of the testing, or both.

When the result of the memory testing indicates that a fault was detected at the memory location 188 of the first DRAM die layer 182, the memory controller 170 may determine that the second DRAM die layer 186 will continue to be used instead of the first DRAM die layer 182 (or instead of the memory location 188) and is unavailable to be used as a spare DRAM die layer (or as a spare memory location). For example, a warning regarding the first DRAM die layer 182 may be generated, a warning regarding unavailability of the second DRAM die layer 186 may be generated, or other operations may be performed.

On the other hand, when the result of the memory testing indicates that a fault was not detected at the memory location 188 of the first DRAM die layer 182, a chip mark 178 associated with the memory location 188 may be placed (e.g., by the memory controller 170, by the firmware 162, or by the ECC decoder 176) in the ECC decoder 176 to direct accesses of the memory location 188 to the ECC decoder 176 instead of to the second DRAM die layer 186. The memory controller 170 may also send a request to the test engine 190 to enable the logic DRAM die layer 184 to direct an access of the second DRAM die layer 186 by the memory controller 170 received by the logic DRAM die layer 184 for data associated with the memory location 188 to the first DRAM die layer 182. For example, the test engine 190 may provide the first MUX of the logic DRAM die layer 184 associated with the first DRAM die layer 182 a first control signal and a first value (e.g., an identifier associated with the memory controller 170) to enable an access by the memory controller 170 of the memory location 188. The test engine 190 may provide the second MUX of the logic DRAM die layer 184 associated with the second DRAM die layer 186 a second control signal and a second value (e.g., an identifier associated with the memory controller 170, an identifier associated with the first DRAM die layer 182, or both) to disable an access by the memory controller 170 of the memory location 188 to be directed to the second DRAM die layer 186.

After the logic DRAM die layer 184 is enabled to direct an access of the user data of the memory location 188 by the memory controller 170 received by the logic DRAM die layer 184 to the memory location 188, the scrub engine 172 may perform an atomic read-modify-write on the DRAM stack 180. For example, the scrub engine 170 may read data from all of the DRAM die layers of the DRAM stack 180, modify the data by copying data associated with the memory location 188 over the data read from the first DRAM die layer 182, and write the modified data back to the DRAM die layers. After the atomic read-modify-write operation is complete, the memory controller 170 may remove the chip mark 178 so that subsequent accesses to the memory location 188 of the first DRAM die layer 182 may be directed to the first DRAM die layer 182 instead of to the ECC decoder 176.

Thus, FIG. 1 illustrates a particular embodiment of memory testing of 3D memory. The memory testing may be implemented by directing accesses of user data at a memory location of a DRAM die layer to a spare DRAM die layer while the memory location is being tested. The use of the spare DRAM die layer may enable the ECC decoder to correct other errors during memory testing.

Figure 2:
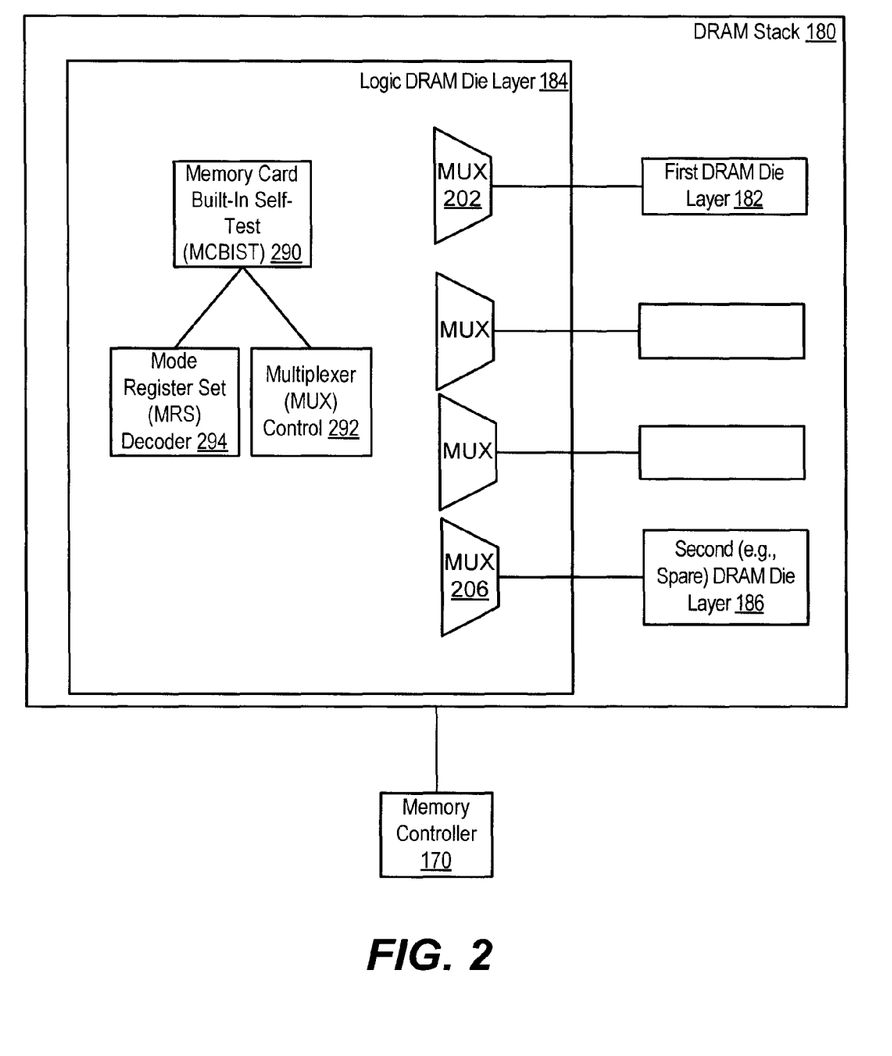
FIG. 2 is a block diagram illustrating in greater detail an exemplary implementation of the computer of FIG. 1.

FIG. 2 is a block diagram illustrating in greater detail an exemplary implementation of the computer of FIG. 1. In FIG. 2, the DRAM stack 180 of FIG. 1 is shown in greater detail. The logic DRAM die layer 184 includes a memory card built-in self-test (MCBIST) 290 coupled to a mode register set (MRS) decoder 294 and to a multiplexer (MUX) control 292. In a particular embodiment, the MCBIST 290 may include, may be included within, or may correspond to the test engine 190 of FIG. 1. The MRS decoder 294 may send and receive messages (e.g., MRS commands) to and from the memory controller 170. The MCBIST 290, the MRS 294, and the MUX control 292 may be coupled to one or more multiplexers (MUXs) of the logical DRAM die layer 184. Each MUX may be coupled to a particular DRAM die layer. For example, a first MUX 202 may be coupled to the first DRAM die layer 182. As another example, a second MUX 206 may be coupled to the second DRAM die layer 186. The MUX control 292 may send a control signal to one or more of the MUXs. Although the logic DRAM die layer 184 is illustrated beside the other DRAM die layers of the DRAM stack 180, it should be understood that the DRAM die layers (including the logic DRAM die layer 184) may be stacked upon each other.

In a particular embodiment, the MRS decoder 294 may receive a request (e.g., a MRS command) from the memory controller 170 to direct an access of a memory location 188 of the first DRAM die layer 182 to a spare DRAM die layer (e.g. the second DRAM die layer 186). The MRS decoder 294 (or the MCBIST 290) may send a first value (e.g., an identifier associated with the memory controller 170) to the first MUX 202 associated with the first DRAM die layer 182. Additionally, the MUX control 292 may send a first control signal to the first MUX 202 to disable an access by the memory controller 170 (e.g., identified by the first value) of the memory location 188 of the first DRAM die layer 182, as described with reference to FIG. 1. The MRS decoder 294 (or the MCBIST 290) may send a second value (e.g., an identifier associated with the memory controller 170) to the MUX control 292 associated with the second DRAM die layer 186. Additionally, the MUX control 292 may send a second control signal to the second MUX 206 to enable the access by the memory controller 170 (e.g., identified by the second value) to the memory location 188 to be directed to the second DRAM die layer 186, as described with reference to FIG. 1.

In a particular embodiment, after the logic DRAM die layer 184 is enabled to direct an access of a memory location 188 of the first DRAM die layer 182 to a spare DRAM die layer, the memory controller 170 may perform an atomic read-modify-write operation. The atomic read-modify-write operation may copy data associated with the memory location 188 to the spare DRAM die layer, as described with reference to FIG. 1. In a particular embodiment, a read access by the memory controller 170 of the memory location 188 may be directed to the ECC decoder 176. In this embodiment, data read from the DRAM die layers may include data associated with the memory location 188 received from the ECC decoder 176. In a particular embodiment, a write access by the memory controller 170 of the memory location 188 may be directed to the logical DRAM die layer 184 instead of to the ECC decoder 176. In this embodiment, the data read from the DRAM die layers including the data associated with the memory location 188 generated by the ECC decoder 176 may be written to the DRAM die layers. Since MUXS 202 and 206 are enabled to direct an access of the memory location 188 of the first DRAM die layer 182 to the second DRAM die layer 186, the data associated with the memory location 188 may be written to the second DRAM die layer 186.

In a particular embodiment, the MCBIST 290 may receive a request (e.g., a MRS command) from the memory controller 170 to initiate memory testing of the memory location 188 of FIG. 1. The MCBIST 290 may send a first value (e.g., an identifier associated with the memory location 188) to the first MUX 202. Additionally, the MUX control 292 may send a control signal to the first MUX 202 to enable the MCBIST 290 to read and write values to the memory location 188 of the first DRAM die layer 182. The MCBIST 290 may update a value in the register 192 of FIG. 1 to indicate completion of the memory diagnostics. In a particular embodiment, the MRS decoder 294 may write a MRS command to the register 192 indicating a status of the testing (i.e., whether the MCBIST 290 has completed the memory diagnostics) and a result of the testing (e.g., whether a fault was detected at the memory location 188).

In a particular embodiment, when the result of the testing indicates that a fault was not detected at the memory location 188, the memory controller 170 may place a chip mark 178 associated with the memory location 188 and send a request (e.g., a MRS command) to the MCBIST 290 to direct an access of the spare DRAM die layer 186 for data associated with the memory location 188 to the memory location 188 of the first DRAM die layer 182. The MCBIST 290 (or the MRS decoder 294) may send a first value (e.g., an identifier associated with the memory controller 170) to the first MUX 202 associated with the first DRAM die layer 182. Additionally, the MUX control 292 may send a control signal to the first MUX 202 to enable an access by the memory controller 170 of the memory location 188 (e.g., identified by the first value) of the first DRAM die layer 182, as described with reference to FIG. 1. The MCBIST 290 (or the MRS decoder 294) may send a second value to the second MUX 206 associated with the second DRAM die layer 186. Additionally, the MUX control 292 may send a second control signal to the second MUX 206 to disable an access by the memory controller 170 (e.g., identified by the second value) for data associated with the memory location 188 of the first DRAM die layer 182 to be directed to the second DRAM die layer 186, as described with reference to FIG. 1.

In a particular embodiment, after the logic DRAM die layer 184 is enabled to direct an access of the memory location 188 to the memory location 188, the memory controller 170 may perform an atomic read-modify-write operation. For example, the scrub engine 172 of FIG. 1 of the memory controller 170 may read data from all the DRAM die layers of the DRAM stack. In a particular embodiment, data read from the DRAM die layers may include data associated with the memory location 188 received from the ECC decoder 176. In a particular embodiment, a write access by the memory controller 170 of the memory location 188 may be directed to the logical DRAM die layer 184 instead of to the ECC decoder 176. In this embodiment, the data read from the DRAM die layers including the data associated with the memory location 188 generated by the ECC decoder 176 may be written to the DRAM die layers. Since access by the memory controller 170 to the memory location 188 is enabled by the MUXS 202 and 206, the data associated with the memory location 188 may be written to the memory location 188 of the first DRAM die layer 182.

Figure 3:
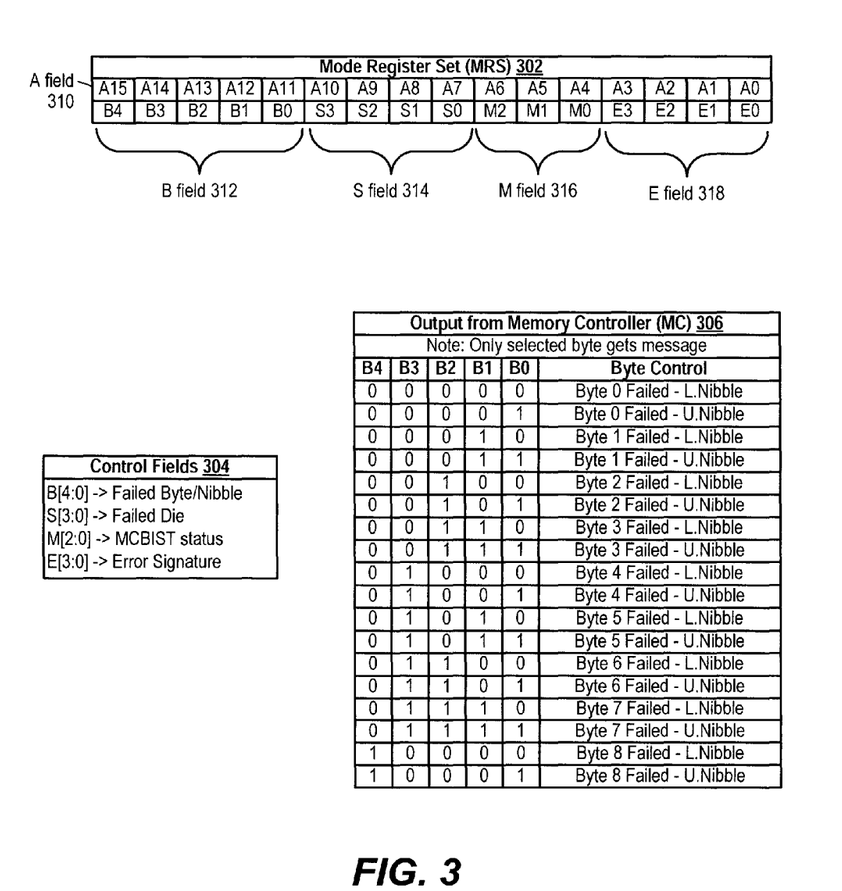
FIG. 3 is a diagram illustrating exemplary fields of a mode register set command that may be used by the computer of FIG. 1.

FIG. 3 is a diagram illustrating exemplary fields of a mode register set (MRS) that may be used by the computer of FIG. 1. An MRS command may be used for communication between the memory controller 170 of FIG. 1 and the DRAM stack 180, as described with reference to FIGS. 1-2. An exemplary MRS command 302, as illustrated in FIG. 3, includes an A field 310 (e.g., 16 bits long), a B field 312 (e.g., 5 bits long), an S field 314 (e.g., 4 bits long), an M field 316 (e.g., 3 bits long), and an E field 318 (e.g., 4 bits long). The A field 310 may indicate an address for control fields (e.g., control fields 304). The control fields 304 may provide examples of information that may be indicated by values of the B field 312, the S field 314, the M field 316, and the E field 318. For example, the B field 312 may indicate a particular memory location (e.g., an upper nibble of a particular DRAM die layer, a lower nibble of a particular DRAM die layer, or a particular DRAM die layer). The S field 314 may indicate whether a fault is detected at a particular DRAM die layer. The M field 316 may indicate whether the test engine 190 of FIG. 1 or the MCBIST 290 of FIG. 2 has completed memory diagnostics. The M field 316 may also, or in the alternative, be used to request directing (or steering) of an access of a particular DRAM die layer to another particular DRAM die layer. The M field 316 may also, or in the alternative, be used to request memory testing to begin. The E field 318 may indicate an error signature.

Output from memory controller (MC) 306 illustrates examples of particular memory locations that may be indicated by particular values of the B field 312. For example, a binary value of '00000' may indicate a lower nibble of a particular DRAM die layer (e.g., a $0^{th}$ DRAM die layer). As another example, a binary value of '10001' may indicate an upper nibble of another particular DRAM die layer (e.g., an $8^{th}$ DRAM die layer).

Although particular numbers (e.g., 3, 4, and 5) of bits are illustrated for various fields of the MRS command, it should be understood that the fields of a MRS command may have other than the number of illustrated bits in other embodiments. It should also be understood that the MRS command may have a length less than or greater than the illustrated 32 bits. In a particular embodiment, the MRS command may include fewer fields, more fields, or different fields than the fields illustrated in FIG. 3.

Figure 4:
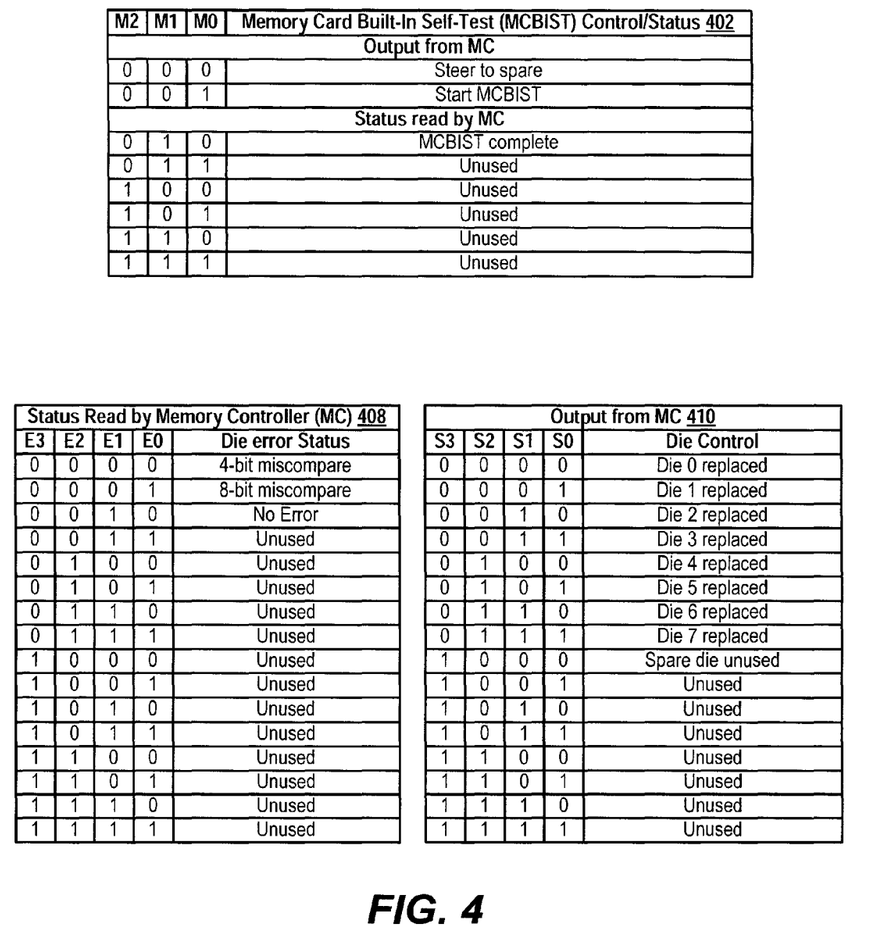
FIG. 4 is a diagram illustrating additional exemplary fields of a mode register set command that may be used by the computer of FIG. 1.

FIG. 4 is a diagram illustrating additional exemplary fields of a mode register set (MRS) command that may be used by the computer of FIG. 1. MCBIST control/status 402 illustrates examples of information that may be indicated by various values of the M field 316 of FIG. 3. For example, a binary value '000' may indicate a request by the memory controller 170 of FIG. 1 to direct access of a particular memory location (e.g., indicated by the B field 312) to a spare DRAM die layer (e.g., the second DRAM die layer 186 of FIG. 1). As another example, a binary value '001' may indicate a request by the memory controller 170 to begin memory diagnostics of a particular memory location (e.g., indicated by the B field 312). As a further example, the binary value '010' may indicate that the MCBIST 290 of FIG. 2 has completed memory testing.

Status read by memory controller 408 illustrates examples of information that may be indicated by various values of the E field 318 of FIG. 3. For example, a binary value of '0010' may indicate that no fault was detected at a particular memory location (e.g., indicated by the B field 312). On the other hand, a binary value of '0000' or '0001' may indicate that a fault was detected at the particular memory location. For example, the binary value of '0000' may indicate a 4-bit miscompare. As another example, the binary value of '0001' may indicate an 8-bit miscompare.

Output from memory controller 410 indicates examples of information that may be indicated by various values of the S field 314 of FIG. 3. For example, a binary value of '1000' may indicate that the spare DRAM die layer is unused. As another example, a binary value of '0000' may indicate that a particular DRAM die layer (e.g., a $0^{th}$ DRAM die layer) was replaced by the spare DRAM die layer.

In a particular embodiment, the memory controller 170 of FIG. 1 may send an MRS command to the test engine 190 of FIG. 1 (or to the MCBIST 290 of FIG. 2) to enable directing an access of a particular memory location of a particular DRAM die layer to another memory location of another DRAM die layer. In this example, the M field 402 of the MRS command may have a binary value of '000' to indicate that the MRS command is a request to direct access from a particular DRAM die layer to another DRAM die layer. In this example, a binary value of '1000' of the S field 410 may indicate that access is to be directed away from a spare DRAM die layer (e.g., the second DRAM die layer 186 of FIG. 1). A binary value other than '1000' of the S field 410 may indicate that access is to be directed to the spare DRAM die layer. A value of the B field 306 of the MRS command may identify the particular memory location (e.g., the memory location 188 of the first DRAM die layer 182 of FIG. 1) that access is to be directed to or away from based on the value of the S field 410. For example, a binary value of '01000' may indicate a lower nibble of a particular DRAM die layer (e.g., a $4^{th}$ DRAM die layer). In response to the MRS command of this example, the test engine 190 of FIG. 1 (or the MCBIST 290 of FIG. 2) may enable directing an access of a particular DRAM die layer to another particular DRAM die layer, as described with reference to FIGS. 1-2.

In a particular embodiment, the memory controller 170 of FIG. 1 may send an MRS command to the test engine 190 of FIG. 1 (or to the MCBIST 290 of FIG. 2) to direct the test engine 190 (or the MCBIST 290) to start memory diagnostics of a particular memory location of a particular DRAM die layer (e.g., the memory location 188 of the first DRAM die layer 182 of FIG. 1). In this example, the M field 402 of the MRS command may have a binary value of '001' to indicate that the MRS command is a request to start memory diagnostics. A value of the B field 306 of the MRS command may identify the particular memory location that is to be tested. For example, a binary value of '01001' may indicate an upper nibble of a particular DRAM die layer (e.g., a $4^{th}$ DRAM die layer). In response to the MRS command of this example, the test engine 190 of FIG. 1 (or the MCBIST 290 of FIG. 2) may begin memory diagnostics, as described with reference to FIGS. 1-2.

In a particular embodiment, the memory controller 170 of FIG. 1 may read an MRS command of the test engine 190 of FIG. 1 (or the MCBIST 290 of FIG. 2) to determine a status and a result of the performing the memory diagnostics. In this example, the M field 402 of the MRS command may have a binary value of '010' to indicate that the test engine 190 (or the MCBIST 290) has completed the memory testing. The E field 408 may have a binary value of '0010' to indicate that a fault was not detected at the memory location (e.g., the memory location 188 of the first DRAM die layer 182 of FIG. 1). A value of '0000' or '0001' of the E field 408 may indicate that a fault was detected at the memory location. In a particular embodiment, the memory controller 170 may determine the memory location based on a most recent request sent to the test engine 190 (or to the MCBIST 290). In another particular embodiment, the memory location may be indicated by the B field 306. Thus, when the M field 402 indicates that the memory testing has been completed, the memory controller may determine whether a fault was detected at the memory location based on a value of the E field 408, a value of the B field 306, or both, as described with reference to FIGS. 1-2.

Figure 5:
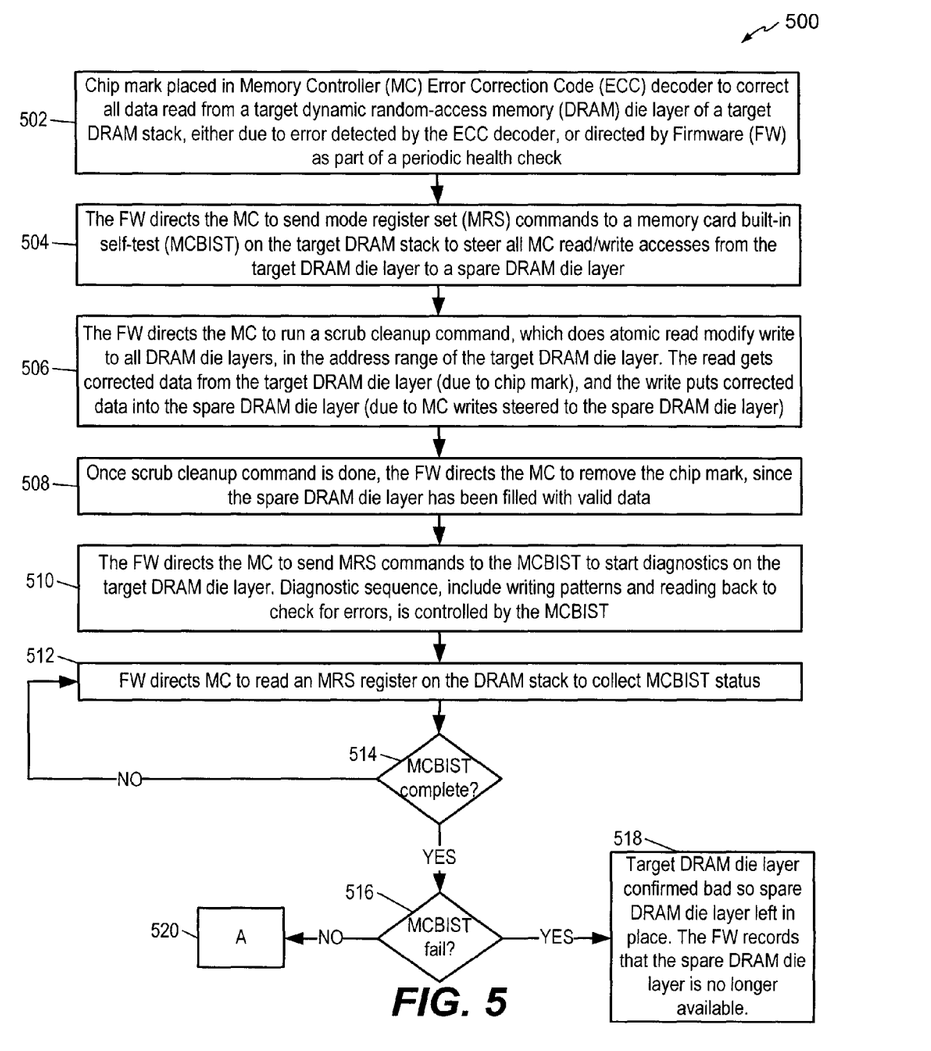
FIG. 5 is a flow chart illustrating a first exemplary sequence of operations that may be performed by the computer of FIG. 1 to implement memory testing.

FIG. 5 is a particular embodiment of a method 500 outlining a sequence of operations performed by the computer of FIG. 1 to implement memory testing. In an illustrative embodiment, the method 500 may be described with reference to FIGS. 1-4.

In the method 500, a chip mark is placed in a memory controller (MC) error correction code (ECC) decoder to correct all data read from a target dynamic random-access memory (DRAM) die layer of a target DRAM stack, either due to error detected by the ECC decoder, or directed by firmware (FW) as part of a periodic health check, at 502. For example, in FIG. 1, a chip mark 178 may be placed in the ECC decoder 176 in response to the ECC decoder 176 detecting an error at a memory location 188 of a first DRAM die layer 182. As another example, the firmware 162 may direct the memory controller 170 to place the chip mark 178 as part of a periodic health check of memory.

The method 500 also includes the firmware directing the memory controller to send mode register set (MRS) commands to a memory card built-in self-test (MCBIST) on the target DRAM stack to steer all memory controller read/write accesses from the target DRAM die layer to a spare DRAM die layer, at 504. For example, in FIG. 1, the firmware 162 may send an MRS command to the test engine 190 of the logic DRAM die layer 184 of the DRAM stack 180 to enable directing an access (e.g., a read access, a write access, or both) of a memory location 188 of the first DRAM die layer 182 to a spare DRAM die layer (e.g., the second DRAM die layer 186). The test engine 190 may include the MCBIST 290 of FIG. 2.

The method 500 further includes the firmware directing the memory controller to run a scrub cleanup command, which does atomic read modify write to all DRAM die layers, in the address range of the target DRAM die layer. The read gets corrected data from the target DRAM die layer (due to chip mark). The write puts corrected data into the spare DRAM die layer (because writes from the memory controller are steered to the spare DRAM die layer), at 506. For example, in FIG. 1, the firmware 162 may direct the memory controller 170 to initiate a scrub clean up command, and the scrub engine 172 may perform an atomic read-modify-write operation, as described with reference to FIGS. 1-2.

The method 500 also includes, after scrub cleanup command is done, the firmware directing the memory controller to remove the chip mark (e.g. because the spare DRAM die layer has been provided with valid data), at 508. For example, in FIG. 1, the firmware 162 may direct the memory controller 170 to remove the chip mark 178 after the atomic read-modify-write operation is complete.

The method 500 further includes, at 510, the firmware directing the memory controller to send MRS commands to the MCBIST to start diagnostics on the target DRAM die layer. The MCBIST controls the diagnostic sequence, including writing patterns and reading back to check for errors. For example, in FIG. 1, the firmware 162 may direct the memory controller 170 to send an MRS command to the test engine 190 to start diagnostics of the memory location 188 of the first DRAM die layer 182. The test engine 190 may write multiple test patterns in turn and compare a value read back after writing each test pattern to the test pattern to determine whether a fault is detected at the memory location 188.

The method 500 also includes the firmware directing the memory controller to read an MRS register on the DRAM stack to collect MCBIST status, at 512. For example, in FIG. 1, the firmware 162 may direct the memory controller 170 to read a value of the register 192 on the DRAM stack 180.

The method 500 further includes determining whether the MCBIST has completed diagnostics, at 514. For example, in FIG. 1, the memory controller 170 may determine whether the test engine 190 has completed memory testing based on the value read from the register 192. The method 500 returns to 512 in response to determining that the MCBIST has not completed diagnostics. For example, in FIG. 1, when the memory controller 170 determines that the value of the register 192 indicates that the test engine 190 has not completed memory, the memory controller 170 may read a value of the register 192 again (e.g., after a certain time period has elapsed).

The method 500 also includes determining whether a fault was detected by the MCBIST in response to determining that the MCBIST has completed diagnostics, at 516. For example, in FIG. 1, the memory controller 170 may determine whether a fault was detected by the test engine 190 based on the value of the register 192 when the value of the register 192 indicates that the test engine 190 has completed the memory testing. In a particular embodiment, the register 192 to may store a MRS command having a particular field to indicate whether the memory testing is complete and another particular field to indicate whether a fault was detected during memory testing, as described with reference to FIGS. 1-4.

The method 500 further includes, at 518, leaving the spare DRAM die layer in place based on confirming that the target DRAM die is bad (i.e., in response to determining that a fault was detected by the MCBIST). For example, the spare DRAM die layer may continue to be used instead of the target DRAM die layer. The firmware may record that the spare DRAM die layer is no longer available. For example, in FIG. 1, the firmware 162 may determine that the spare DRAM die layer is unavailable to be used as a redundant die layer in response to determining that a fault was detected by the test engine 190. The method 500 proceeds to 520 in response to determining that a fault was not detected by the MCBIST.

Figure 6:
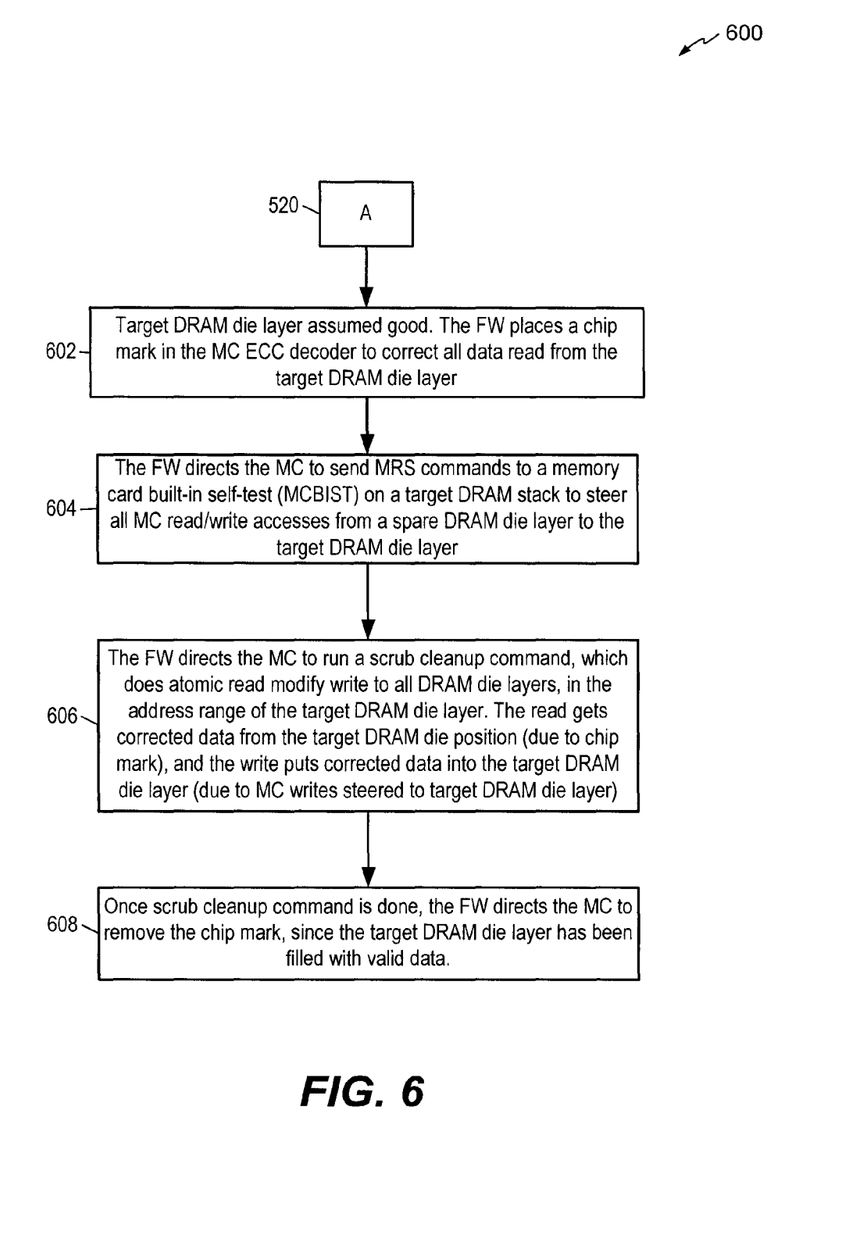
FIG. 6 is a flow chart illustrating a second exemplary sequence of operations that may be performed by the computer of FIG. 1 to implement memory testing.

FIG. 6 is a particular embodiment of a method 600 outlining a sequence of operations performed by the computer of FIG. 1 to implement memory testing. In an illustrative embodiment, the method 600 may be described with reference to FIGS. 1-4.

The method 600 begins at 520 of FIG. 5. The method 600 includes assuming that the target DRAM die layer is good, and the firmware placing a chip mark in the memory controller ECC decoder to correct all data read from the target DRAM die, at 602. For example, in FIG. 1, the firmware 162 may assume that the first DRAM die layer 182 remains usable based on the memory controller 170 determining that a fault was not detected at the memory location 188. The firmware 162 may place a chip mark 178 on the ECC decoder 176 to enable an access of data associated with the first DRAM die layer 182 to be directed to the ECC decoder 176 instead of to the spare DRAM die layer, as described with reference to FIGS. 1-2.

The method 600 also includes the firmware directing the memory controller to send MRS commands to a memory card built-in self-test (MCBIST) on a target DRAM stack to steer all memory controller read/write accesses from a spare DRAM die layer to the target DRAM die layer, at 604. For example, in FIG. 1, the firmware 162 may direct the memory controller 170 to send a MRS command to the test engine 190 of the logic DRAM die layer 184 of the DRAM stack 180 to enable an access (e.g., a read access, a write access, or both) by the memory controller 170 of the spare DRAM die layer to be directed to the first DRAM die layer 182, as described with reference to FIGS. 1-4.

The method 600 further includes, at 606, the firmware directing the memory controller to run a scrub cleanup command. The scrub cleanup operation does atomic read modify write to all DRAM die layers, in the address range of the target DRAM die layers, the read getting corrected data from the target DRAM die position (due to chip mark), and the write putting corrected data into the target DRAM die (due to memory controller writes steered to target DRAM die). For example, in FIG. 1, the firmware 162 may direct the memory controller 170 to initiate a scrub clean up command, and the scrub engine 172 may perform an atomic read-modify-write operation, as described with reference to FIGS. 1-2.

The method 600 also includes, after scrub cleanup command is done, the firmware directing the memory controller to remove the chip mark (e.g., because the target DRAM die layer has been provided with valid data), at 608. For example, in FIG. 1, the firmware 162 may direct the memory controller 170 to remove the chip mark 178 after the atomic read-modify-write operation is complete.

Figure 7:
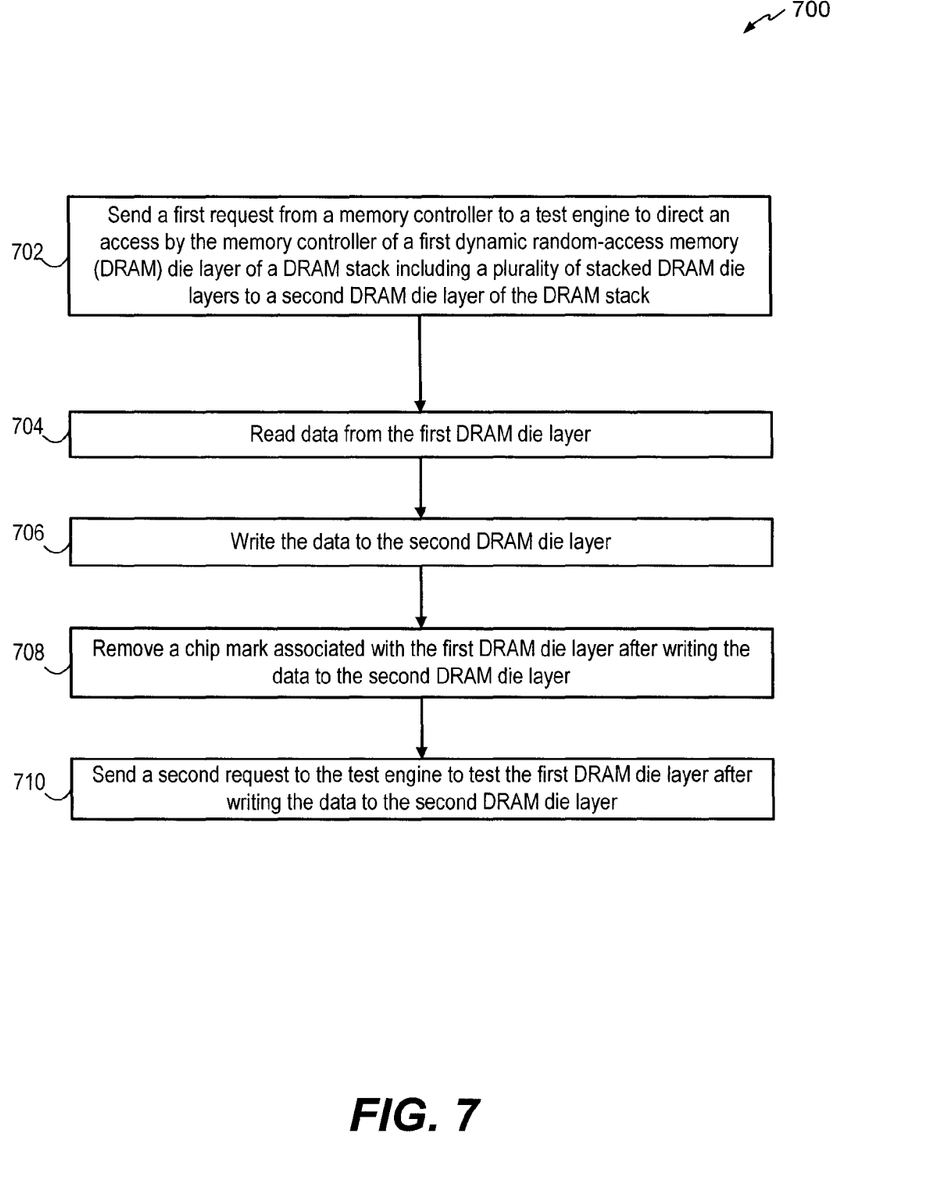
FIG. 7 is a flow chart illustrating a third exemplary sequence of operations that may be performed by the computer of FIG. 1 to implement memory testing.

FIG. 7 is a particular embodiment of a method 700 outlining a sequence of operations performed by the computer of FIG. 1 to implement memory testing. In an illustrative embodiment, the method 700 may be described with reference to FIGS. 1-4.

The method 700 includes sending a first request from a memory controller to a test engine to direct an access by the memory controller of a first dynamic random-access memory (DRAM) die layer of a DRAM stack including a plurality of stacked DRAM die layers to a second DRAM die layer of the DRAM stack, at 702. For example, in FIG. 1, the memory controller 170 may send a request to the test engine 190 to enable an access by the memory controller 170 of the first DRAM die layer 182 of the DRAM stack 180 to be directed to a spare DRAM die layer (e.g., the second DRAM die layer 186), as described with reference to FIGS. 1-4.

The method 700 further includes reading data from the first DRAM die layer, at 704, and writing the data to the second DRAM die layer, at 706. For example, in FIG. 1, the scrub engine 172 of the memory controller 170 may read data associated with the first DRAM die layer 182 and write the data to the spare DRAM die layer, as described with reference to FIGS. 1-2.

The method 700 further includes removing a chip mark associated with the first DRAM die layer after writing the data to the second DRAM die layer, at 708. For example, in FIG. 1, the memory controller 170 may remove the chip mark 178 after the scrub engine 172 has completed writing the data to the spare DRAM die layer.

The method 700 also includes sending a second request to the test engine to test the first DRAM die layer after writing the data to the second DRAM die layer, at 710. For example, in FIG. 1, the memory controller 170 may send a second request to the test engine 190 to begin diagnostics of the first DRAM die layer 182, as described with reference to FIGS. 1-4.

Figure 8:
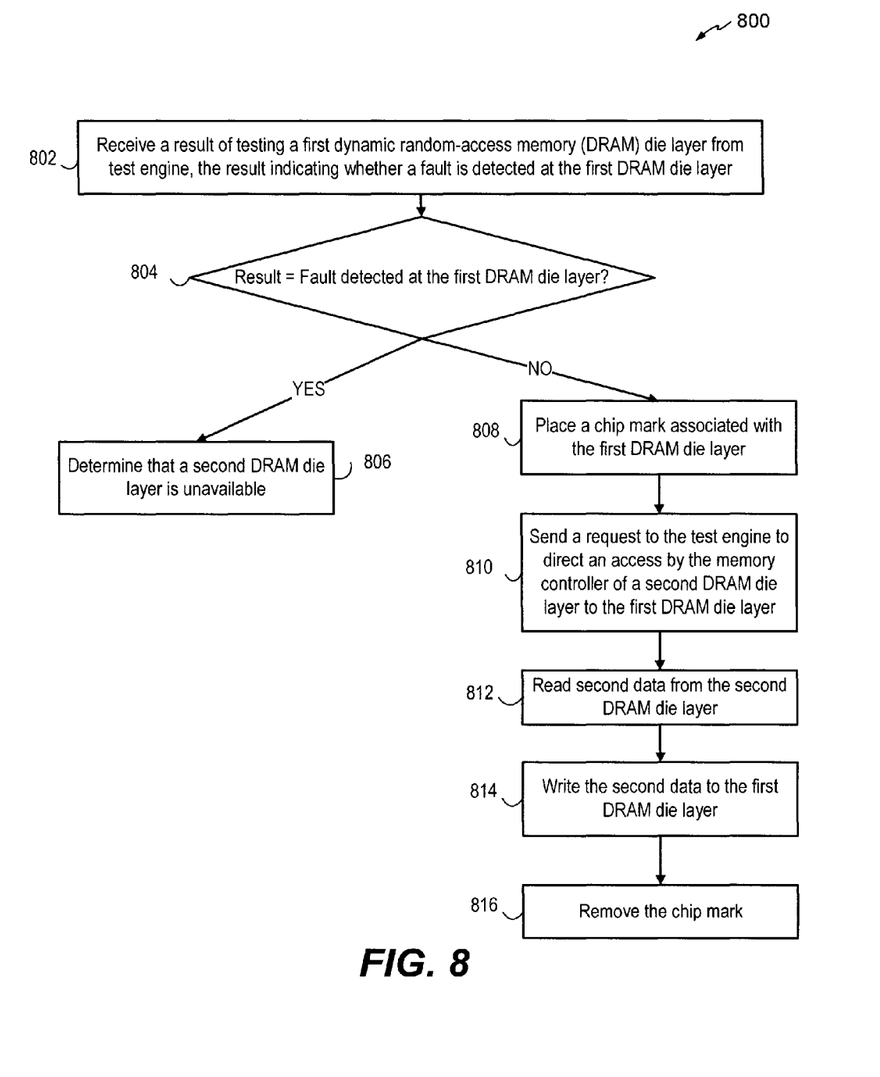
FIG. 8 is a flow chart illustrating a fourth exemplary sequence of operations that may be performed by the computer of FIG. 1 to implement memory testing.

FIG. 8 is a particular embodiment of a method 800 outlining a sequence of operations performed by the computer of FIG. 1 to implement memory testing. In an illustrative embodiment, the method 800 may be described with reference to FIGS. 1-4.

The method 800 includes receiving a result of testing a first dynamic random-access memory (DRAM) die layer from the test engine, the result indicating whether a fault is detected at the first DRAM die layer, at 802. For example, in FIG. 1, the memory controller 170 may read a value of the register 192 to determine a result of the diagnostics performed by the test engine 190, as described with reference to FIGS. 1-4.

The method 800 also includes determining whether the result indicates that a fault was detected at the first DRAM die layer, at 804. For example, in FIG. 1, the memory controller 170 may determine whether the value of the register 192 indicates that a fault was detected by the test engine 190 at the first DRAM die layer 182.

The method 800 further includes determining that the second DRAM die layer is unavailable in response to determining that a fault is detected at the first DRAM die layer, at 806. For example, in FIG. 1, the memory controller 170 may determine that the spare DRAM die layer is no longer available to be used as a redundant die layer when the value of the register 192 indicates that a fault was detected at the first DRAM die layer 182.

The method 800 also includes placing a chip mark associated with the first DRAM die layer in response to determining that a fault is not detected at the first DRAM die layer, at 808. For example, in FIG. 1, the memory controller 170 may place a chip mark 178 associated with the first DRAM die layer 182 at the ECC decoder 176 to direct an access of data associated with the first DRAM die layer 182 to the ECC decoder 176 instead of to the spare DRAM die layer.

The method 800 further includes sending a request to the test engine to direct an access by the memory controller of a second DRAM die layer to the first DRAM die layer, at 810. For example, in FIG. 1, the memory controller 170 may send a request to the test engine 190 to enable an access (e.g., a read access, a write access, or both) by the memory controller of the spare DRAM die layer to be directed to the first DRAM die layer 182, as described with reference to FIGS. 1-4.

The method 800 also includes reading second data from the second DRAM die layer, at 812, and writing the second data to the first DRAM die layer, at 814. For example, in FIG. 1, the scrub engine 172 of the memory controller 170 may read data associated with the first DRAM die layer 182 from the ECC decoder 176 and write the data to the first DRAM die layer 182, as described with reference to FIGS. 1-2.

The method 800 further includes removing the chip mark, at 816. For example, in FIG. 1, the memory controller 170 may remove the chip mark 178 after the scrub engine 172 has completed writing the data to the first DRAM die layer 182.

Memory testing with use of an ECC decoder and a spare DRAM die layer utilizing one or more test patterns, which may be designed to detect various faults, may enable memory testing during runtime with an increased likelihood of detecting faults in comparison to detecting errors using other memory testing algorithms, such as parity checking. Moreover, use of the spare DRAM die layer may enable the ECC decoder to correct other errors while accesses of user data associated with the DRAM die layer being tested are directed to the spare DRAM die layer. Use of a spare DRAM die layer instead of a faulty DRAM die layer may reduce the likelihood of having to replace an entire DRAM stack when a fault is detected in a DRAM die layer of the DRAM stack.

Figure 9:
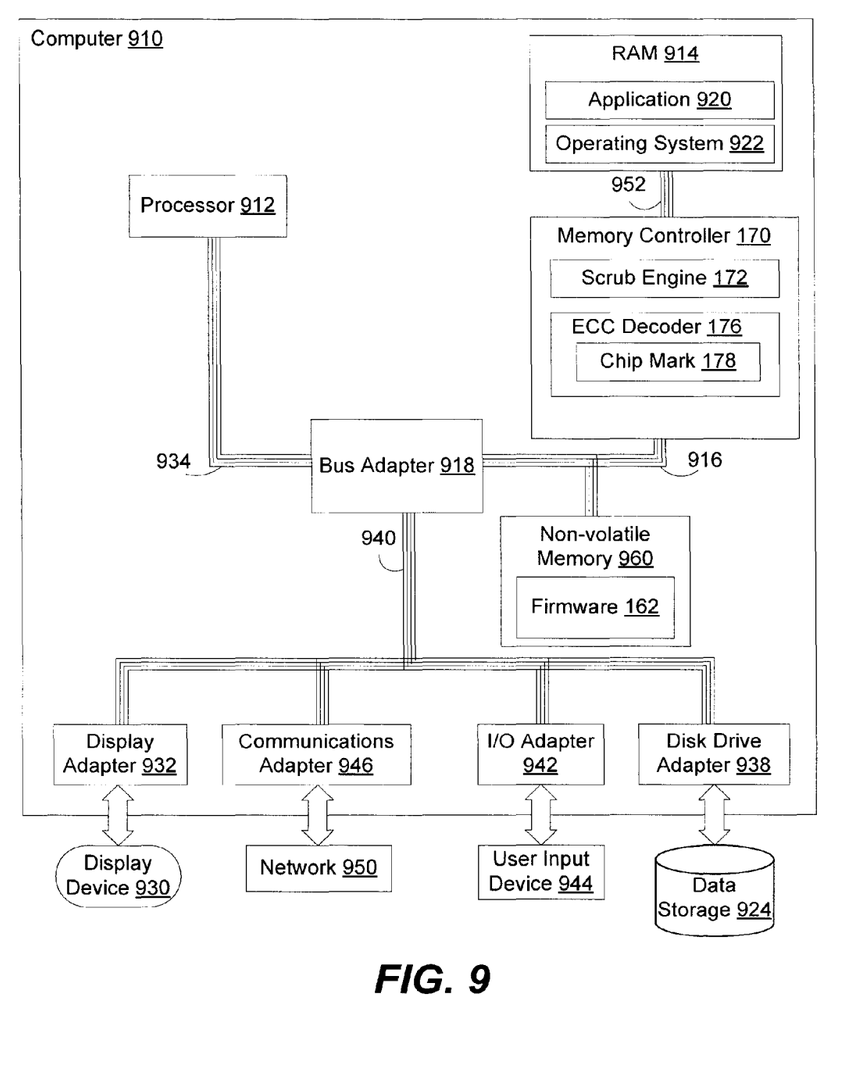
FIG. 9 is a block diagram of an exemplary computer system operable to support embodiments of computer-implemented methods, computer program products, and system components as illustrated in FIGS. 1-8.

FIG. 9 illustrates exemplary automated computing machinery including a computer 910. The computer 910 is an exemplary implementation of the computer of FIG. 1. The computer 910 includes at least one computer processor (CPU) 912 as well as a random access memory ("RAM") 914, a memory controller 170, and a non-volatile memory 960. The RAM 914 is connected through a high speed memory bus 952 to the memory controller 170. The memory controller 170 and the non-volatile memory 960 are connected through a high speed memory bus 916 and a bus adapter 918 to the processor 912 through a processor bus 934.

The memory controller 170 includes a scrub engine 172 and an error correction code (ECC) decoder 176. The ECC decoder 176 may store a chip mark 178. The non-volatile memory 960 includes firmware 162. In a particular embodiment, the firmware 162 may direct the memory controller 170 to perform runtime memory testing at a memory location of a DRAM stack of the RAM 914. For example, the firmware 162 may place the chip mark 178 associated with the memory location and direct the memory controller 170 to initiate memory testing at the memory location, as described with reference to FIG. 1.

Stored in the RAM 914 is an application 920, which may be a module of user-level computer program instructions for carrying out particular tasks (e.g., word processing, spreadsheets, database operations, video gaming, stock market simulations, graphics simulations, atomic quantum process simulations, or other user-level applications). Also stored in the RAM 914 is an operating system 922. Operating systems useful in connection with disclosed embodiments include, but are not limited to, UNIX® (a registered trademark of The Open Group), Linux® (a registered trademark of Linus Torvalds), Windows® (a registered trademark of Microsoft Corporation, Redmond, Wash., United States), AIX® (a registered trademark of International Business Machines (IBM) Corp., Armonk, N.Y., United States) i5/OS® (a registered trademark of IBM Corp.), and others as will occur to those of skill in the art. The operating system 922 and the application 920 in the example of FIG. 9 are shown in RAM 914, but components of such software may also, or in addition, be stored in non-volatile memory (e.g., on data storage, such as illustrative data storage 924 and/or the non-volatile memory 960).

The computer 910 includes a disk drive adapter 938 coupled through an expansion bus 940 and the bus adapter 918 to the processor 912 and other components of the computer 910. The disk drive adapter 938 connects non-volatile data storage to the computer 910 in the form of the data storage 924 and may be implemented, for example, using Integrated Drive Electronics ("IDE") adapters, Small Computer System Interface ("SCSI") adapters, and others as will occur to those of skill in the art. Non-volatile computer memory also may be implemented as an optical disk drive, electrically erasable programmable read-only memory (so-called "EEPROM" or "Flash" memory), RAM drives, and other devices, as will occur to those of skill in the art.

The computer 910 also includes one or more input/output ("I/O") adapters 942, which implement user-oriented input/output through, for example, software drivers and computer hardware for controlling input and output to and from user input devices 944, such as keyboards and mice. In addition, the computer 910 includes a communications adapter 946 for data communications with a data communications network 950. Such data communications may be carried out serially through Recommended Standard 232 (RS-232) connections (sometimes referred to as "serial" connections), through external buses such as a Universal Serial Bus ("USB"), through data communications networks such as internet protocol (IP) data communications networks, and in other ways as will occur to those of skill in the art. The communications adapter 946 implements the hardware level of data communications through which one computer sends data communications to another computer, directly or through a data communications network. Examples of the communications adapter 946 suitable for use in the computer 910 include, but are not limited to, modems for wired dial-up communications, Ethernet (Institute of Electrical and Electronics Engineers (IEEE) 802.3) adapters for wired network communications, and IEEE 802.11 adapters for wireless network communications. The computer 910 also includes a display adapter 932 which facilitates data communication between the bus adapter 918 and a display device 930, enabling the application 920 to visually present output on the display device 930.

In a particular embodiment, the ECC decoder 176 may detect an error associated with a memory location (e.g., a bit, a nibble, a byte, a half word, a word, a double word, a block, 1 bit, 4 bits, 8 bits, 16 bits, 32 bits, 64 bits, etc.) of the RAM 914 and place the chip mark 178 associated with the memory location. The firmware 162 may detect the chip mark 178 and direct the memory controller 170 to enable an access of a particular DRAM die layer associated with the memory location to be directed to a spare DRAM die layer. The firmware 162 may also, or in the alternative, direct the memory controller 170 to initiate an atomic read-modify-write operation (e.g., performed by the scrub engine 172) to copy data of the particular DRAM die layer to the spare DRAM die layer. While the chip mark 178 is in place, a read access of the memory location 178 will receive data from the ECC decoder 176. The firmware 162 may direct the memory controller 170 to remove the chip mark 178 upon completion of the atomic read-modify-write operation. After the chip mark 178 is removed, an access (e.g., a read access, a write access, etc.) of the memory location will be directed to the spare DRAM die layer. The firmware 162 may direct the memory controller 170 to perform memory testing of the memory location. When the memory controller 170 determines that a fault is detected at the memory location, the firmware 162 may determine that the spare DRAM die layer is unavailable to be used as a redundant DRAM die layer. On the other hand, when the memory controller 170 determines that a fault is not detected at the memory location, the firmware 162 may place the chip mark 178 so that an access of data associated with the memory location is directed to the ECC decoder 176. The firmware 162 may also, or in the alternative, direct the memory controller 170 to enable an access of the spare DRAM die layer to be directed to the particular DRAM die layer. The firmware 162 may direct the memory controller 170 to initiate an atomic read-modify-write operation to copy data from the spare DRAM die layer to the particular DRAM die layer. After the atomic read-modify-write operation is complete, the firmware 162 may remove the chip mark 178 so that an access of the memory location is directed to the particular DRAM die layer instead of to the ECC decoder 176 or to the spare DRAM die layer. Thus, the ECC decoder 176 may be available to correct other errors while an access to the user data associated with the memory location is enabled via the spare DRAM die layer during testing of the memory location.

As will be appreciated by one skilled in the art, aspects of the present disclosure may be embodied as a system, a method, a computer program product, or in other manners. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "logic," "module," or "system." Furthermore, aspects of the present disclosure may take the form of a computer program product embodied in one or more computer readable medium(s) having computer-readable program code embodied thereon.

Any combination of one or more computer readable medium(s) may be utilized. The computer readable medium may be a computer readable signal medium or a computer readable storage medium. A computer readable storage medium may be, for example but not limited to, an electronic, magnetic, optical, electromagnetic, infrared, or semiconductor system, apparatus, or device, or any suitable combination of the foregoing. More specific examples (a non-exhaustive list) of the computer-readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a magnetic storage device, or any suitable combination of the foregoing. In the context of this document, a computer readable storage medium may be any tangible medium that can contain, or store a program for use by or in connection with an instruction performing system, apparatus, or device.

A computer-readable signal medium may include a propagated data signal with computer-readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction performing system, apparatus, or device. Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as JAVA (JAVA is a registered trademark of Sun Microsystems), Smalltalk, C++ or the like and conventional procedural programming languages, such as the "C" programming language or similar programming languages. The program code may perform entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described herein with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which perform via the processor of the computer or other programmable data processing apparatus, create means for implementing the functions/acts specified in the flowchart and/or block diagram block or blocks.

These computer program instructions may also be stored in a computer-readable medium that can direct a computer, other programmable data processing apparatus, or other devices to function in a particular manner, such that the instructions stored in the computer-readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which perform on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more performable instructions for implementing the specified logical function(s). It should also be noted that, in some alternative implementations, the functions noted in the block may occur out of the order noted in the figures. For example, two blocks shown in succession may, in fact, be performed substantially concurrently, or the blocks may sometimes be performed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions. Example embodiments may be performed with or without query processing.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A method comprising:
reading, at a memory controller, first data from a first dynamic random-access memory (DRAM) die layer of a DRAM stack comprising a plurality of stacked DRAM die layers in response to detecting a chip mark associated with the first DRAM die layer;
writing the first data to a second DRAM die layer of the DRAM stack; and
after writing the first data to the second DRAM die layer, sending a first request to a test engine to test the first DRAM die layer.

2. The method of claim 1, wherein the chip mark may be placed by firmware based on a periodic health check, by an error correction code (ECC) decoder in response to detecting an error, or both.

3. The method of claim 1, wherein the first request to the test engine includes a mode register set (MRS) command indicating the first DRAM die layer.

4. The method of claim 3, wherein the MRS command indicates a particular memory location of the first DRAM die layer.

5. The method of claim 1, further comprising sending a second request to the test engine to direct an access by the memory controller of the first DRAM die layer to the second DRAM die layer.

6. The method of claim 5, wherein the second request to the test engine includes a mode register set (MRS) command indicating the first DRAM die layer.

7. The method of claim 1, further comprising removing the chip mark associated with the first DRAM die layer after writing the first data to the second DRAM die layer.

8. The method of claim 1, further comprising receiving a result of testing the first DRAM die layer from the test engine, the result indicating whether a fault is detected at the first DRAM die layer.

9. The method of claim 8, further comprising reading the result from a register associated with the test engine.

10. The method of claim 8, wherein the result indicates whether a fault is detected at a particular memory location of the first DRAM die layer.

11. The method of claim 8, further comprising, in response to the result indicating that a fault is not detected at the first DRAM die layer, sending a second request to the test engine to direct an access by the memory controller of the second DRAM die layer to the first DRAM die layer.

12. The method of claim 8, further comprising:
in response to the result indicating that a fault is not detected at the first DRAM die layer:
reading second data from the second DRAM die layer; and
writing the second data to the first DRAM die layer.

13. The method of claim 12, further comprising removing the chip mark associated with the first DRAM die layer after writing the second data to the first DRAM die layer.

14. The method of claim 8, further comprising determining that the second DRAM die layer is unavailable for use as a spare DRAM die layer in response to the result indicating that a fault is detected at the first DRAM die layer.

15. An apparatus comprising:
a dynamic random-access memory (DRAM) stack that includes:
a first DRAM die layer having a length of one byte; and
a logic DRAM die layer comprising logic configured to:
receive a request to test the first DRAM die layer;
perform testing of the first DRAM die layer in response to the request; and
generate a result of testing the first DRAM die layer, wherein the result indicates whether a fault was detected at a particular memory location of the first DRAM die layer, wherein the particular memory location includes an upper nibble on the first DRAM die layer or a lower nibble on the first DRAM die layer.

16. The apparatus of claim 15, wherein the result of testing the first DRAM die layer includes a mode register set (MRS) command indicating whether the fault is detected at the particular memory location of the first DRAM die layer.

17. A computer-readable storage device storing instructions that, when executed by a processor, cause the processor to:
read first data from a first dynamic random-access memory (DRAM) die layer of a DRAM stack comprising a plurality of stacked DRAM die layers in response to detecting a chip mark associated with the first DRAM die layer;
write the first data to a second DRAM die layer of the DRAM stack; and
after writing the first data to the second DRAM die layer, send a first request to a test engine to test the first DRAM die layer.

18. The computer-readable storage device of claim 17, further comprising instructions that, when executed by the processor, cause the processor to read a result of testing the first DRAM die layer from a register.

* * * * *